(12) United States Patent
Orsley et al.

(10) Patent No.: US 9,202,996 B2
(45) Date of Patent: Dec. 1, 2015

(54) LED LIGHTING DEVICES WITH QUANTUM DOT GLASS CONTAINMENT PLATES

(71) Applicant: Corning Incorporated, Corning, NY (US)

(72) Inventors: Timothy James Orsley, San Jose, CA (US); William Richard Trutna, Atherton, CA (US)

(73) Assignee: Corning Incorporated, Corning, NY (US)

( * ) Notice: Subject to any disclaimer, the term of this patent is extended or adjusted under 35 U.S.C. 154(b) by 299 days.

(21) Appl. No.: 13/828,169

(22) Filed: Mar. 14, 2013

(65) Prior Publication Data

US 2014/0151729 A1     Jun. 5, 2014

Related U.S. Application Data

(60) Provisional application No. 61/731,530, filed on Nov. 30, 2012.

(51) Int. Cl.
*H01L 21/00*     (2006.01)
*H01J 1/62*      (2006.01)
*H01L 33/50*     (2010.01)

(52) U.S. Cl.
CPC ............ *H01L 33/505* (2013.01); *H01L 33/504* (2013.01)

(58) Field of Classification Search
CPC ............. H01L 2224/48091; H01L 27/14687; H01L 2924/00014; H01L 27/14692; H01L 27/14603; H01L 27/14609; H01L 27/14601; H01L 27/14647; H01L 27/14652; H01L 31/036; H01L 33/502; H01L 33/58; H01L 33/0079

USPC ............... 257/13, 88, 89, E33.005, E33.06, 257/E33.067
See application file for complete search history.

(56) References Cited

U.S. PATENT DOCUMENTS 6,572,785 B2 *  6/2003  Justel et al. ............. 252/301.4 R
6,957,906 B2   10/2005  Coushaine et al. ........... 362/555

(Continued)

FOREIGN PATENT DOCUMENTS

CN   201373272       12/2009  ................ F21S 2/00
CN   101749554 A      6/2010  ................ F21S 2/00

(Continued)

OTHER PUBLICATIONS

International Search Report and Written Opinion—dated Feb. 19, 2014, International Application No. PCT/US2013/071947, International Filing Date Nov. 26, 2013.

*Primary Examiner* — Mary Wilczewski
*Assistant Examiner* — Tsz Chiu
(74) *Attorney, Agent, or Firm* — Gregory V. Bean; Ryan T. Hardee

(57) ABSTRACT

A lighting device is provided comprising a chip-on-board (COB) light emitting diode (LED) light source, a light source encapsulant, a quantum dot distributed color conversion medium, and a quantum dot glass containment plate. The COB LED light source comprises at least one LED and defines a light source encapsulant cavity in which the light source encapsulant is distributed over the LED. The quantum dot glass containment plate is positioned over the light source encapsulant cavity and contains a quantum dot distributed color conversion medium. The distributed color conversion medium comprises a quantum dot structure and is distributed in two dimensions over an emission field of the lighting device within the quantum dot glass containment plate.

16 Claims, 1 Drawing Sheet

(56) References Cited

U.S. PATENT DOCUMENTS

| | | | |
|---|---|---|---|
| 7,319,289 B2 * | 1/2008 | Suehiro et al. | 313/485 |
| 7,741,770 B2 * | 6/2010 | Cok | H01L 51/5265 |
| | | | 313/498 |
| 7,811,471 B2 | 10/2010 | Iwao et al. | 252/301.4 |
| 7,825,575 B2 * | 11/2010 | Sawanobori et al. | 313/498 |
| 7,932,524 B2 | 4/2011 | Repetto et al. | 257/88 |
| 7,989,236 B2 | 8/2011 | Yamaguchi et al. | 428/26 |
| 8,206,613 B2 | 6/2012 | Fujita et al. | 252/301.4 |
| 8,344,404 B2 | 1/2013 | Fujita et al. | 257/98 |
| 2005/0201716 A1 | 9/2005 | Wuestefeld | 385/147 |
| 2007/0273265 A1 * | 11/2007 | Hikmet | C09K 11/02 |
| | | | 313/483 |
| 2008/0049164 A1 | 2/2008 | Jeon et al. | 349/61 |
| 2008/0284315 A1 | 11/2008 | Tasumi et al. | 313/503 |
| 2009/0173960 A1 | 7/2009 | Martin et al. | 257/98 |
| 2009/0186433 A1 | 7/2009 | Yamaguchi et al. | 438/26 |
| 2010/0219735 A1 | 9/2010 | Sakai et al. | 313/46 |
| 2010/0244286 A1 | 9/2010 | Lagsa | 257/789 |
| 2010/0263723 A1 | 10/2010 | Allen et al. | 136/259 |
| 2010/0320902 A1 | 12/2010 | Yu | 315/32 |
| 2011/0001431 A1 | 1/2011 | Brukilacchio | 315/152 |
| 2011/0068354 A1 | 3/2011 | Tran et al. | 257/89 |
| 2011/0133654 A1 * | 6/2011 | McKenzie et al. | 315/152 |
| 2011/0309325 A1 * | 12/2011 | Park et al. | 257/13 |
| 2012/0195340 A1 * | 8/2012 | Cheon | H01L 33/501 |
| | | | 372/50.1 |
| 2012/0293981 A1 | 11/2012 | Motoya et al. | 362/84 |
| 2013/0015761 A1 | 1/2013 | Motoya et al. | 313/512 |
| 2013/0049575 A1 | 2/2013 | Fujita et al. | 313/503 |
| 2013/0175558 A1 * | 7/2013 | Orsley et al. | 257/88 |
| 2013/0207964 A1 * | 8/2013 | Fleck | H01L 27/156 |
| | | | 345/419 |

FOREIGN PATENT DOCUMENTS

| | | | |
|---|---|---|---|
| CN | 101796157 A | 8/2010 | C09K 11/64 |
| CN | 201748222 U | 2/2011 | F21S 2/00 |
| CN | 102097545 A | 6/2011 | H01L 33/00 |
| CN | 201884988 U | 6/2011 | F21S 2/00 |
| CN | 202074366 U | 12/2011 | F21S 8/02 |
| CN | 102338307 A | 2/2012 | F21K 9/56 |
| CN | 102437271 A | 5/2012 | H01L 33/48 |
| CN | 202216097 U | 5/2012 | F21S 8/00 |
| CN | 202221016 U | 5/2012 | F21S 8/00 |
| DE | 20218291 U1 | 3/2003 | G09F 13/18 |
| DE | 102009013569 | 3/2010 | H01L 31/16 |
| EP | 1880983 | 1/2008 | |
| EP | 1821070 B1 | 4/2008 | G01C 21/36 |
| EP | 2036965 | 3/2009 | C09K 11/00 |
| EP | 2120271 | 11/2009 | H01L 33/50 |
| EP | 2249078 A1 | 11/2010 | F21V 29/00 |
| EP | 2372795 A1 | 10/2011 | H01L 33/50 |
| EP | 2392852 | 12/2011 | F21K 99/00 |
| JP | 2008169348 | 7/2008 | C09K 11/08 |
| JP | 2010118620 A | 5/2010 | H01L 33/48 |
| JP | 2011040315 A | 2/2011 | F21S 8/08 |
| JP | 2011119292 A | 6/2011 | H01L 33/56 |
| JP | 2012031328 | 2/2012 | C09K 11/00 |
| JP | 2012158494 | 8/2012 | C03C 8/04 |
| JP | 2012180488 | 9/2012 | C09K 11/00 |
| KR | 824716 B1 | 4/2008 | G02F 1/13357 |
| KR | 2010135223 | 12/2010 | |
| WO | WO9408090 A1 | 4/1994 | D21H 19/28 |
| WO | WO9967794 A1 | 12/1999 | H01B 1/02 |
| WO | WO2011013505 | 2/2011 | |
| WO | WO2011033325 A1 | 3/2011 | F24D 5/02 |
| WO | WO2011065322 | 6/2011 | |
| WO | WO2011111462 | 9/2011 | |
| WO | WO2012100132 | 7/2012 | |
| WO | WO2012/135744 | 10/2012 | H01L 33/50 |
| WO | WO2013001971 | 3/2013 | |

\* cited by examiner

LED LIGHTING DEVICES WITH QUANTUM DOT GLASS CONTAINMENT PLATES

CROSS REFERENCE TO RELATED APPLICATION

The present application claims priority to U.S. Provisional Application Ser. No. 61/731,530, filed Nov. 30, 2012 (SP12-370P).

BACKGROUND

1. Field

The present disclosure relates to light emitting diode (LED) lighting devices and, more particularly, packaged chip-on-board (COB) LED arrays.

2. Technical Background

Referring initially to FIG. 1, high brightness LED lighting devices, i.e., light sources approaching or exceeding 1000 lumens, typically require a significant number of blue LEDs 10 configured in a two-dimensional array that is secured, for example, to a metal clad PC board 20. In many cases, the diode array is covered by a color conversion phosphor 30 dispersed in a silicone encapsulant 15. These and other types of COB LED arrays are becoming standardized in shape, light output, and electrical drive requirements and could conceivably become the new lighting standard.

BRIEF SUMMARY

According to the subject matter of the present disclosure, a lighting device is provided comprising a chip-on-board (COB) light emitting diode (LED) light source, a light source encapsulant, a quantum dot distributed color conversion medium, and a quantum dot glass containment plate. The COB LED light source comprises at least one LED and defines a light source encapsulant cavity in which the light source encapsulant is distributed over the LED. The quantum dot glass containment plate is positioned over the light source encapsulant cavity and contains a quantum dot distributed color conversion medium. The distributed color conversion medium comprises a quantum dot structure and is distributed in two dimensions over an emission field of the lighting device within the quantum dot glass containment plate.

The quantum dot glass containment plate of the present disclosure is beneficial because it provides for additional manufacturing process control. Specifically, the plate can be tested separately from the corresponding LED array and an appropriate plate-to-array pairing can be made to achieve the desired color output. This is not the case when a conversion medium is provided as a slurry in the silicone used to encapsulate the LED array, although embodiments of the present disclosure also contemplate the use of a conversion medium is provided as a slurry in the silicone.

The glass containment plate, loaded with the color conversion medium, sits just above the wire bonds of the LED array. Plain silicone can be used to surround the LEDs, rather than air, which is a poor thermal conductor. This means that the thickness of the silicone above the LEDs can be reduced to the height of the wire bonds, i.e., about 50 µm with the very low profile variety of wire bonds. This structure is beneficial in a number of ways. First the color conversion medium can itself withstand higher temperature than cases where the medium is dispersed in silicone. Further, the ability to channel heat to the heat sink of the packaged LED is greatly improved because the thickness of the silicone layer above the LEDs is greatly reduced, e.g., from about 750 µm to about 50 µm. It is contemplated that even further thickness reduction would be possible with a flip-chipped LED array as wire bonds would no longer set the thickness requirement. Although perhaps initially counterintuitive, the heat dissipation path for the heat generated by the quantum dots is through the LEDs themselves. The glass of the quantum dot glass containment plate separates the quantum dots from the silicone and the LEDs so, from a thermal transfer perspective, it is preferable to make the glass of the containment plate as thin as possible. It is also noteworthy that the quantum dot medium contained in the quantum dot glass containment plate is typically need only be on the order of about 100 µm or less in thickness, further reducing the thermal path length from the quantum dots to the LED array.

In accordance with one embodiment of the present disclosure, the quantum dot glass containment plate comprises a glass frame and the quantum dot structure is contained within an interior volume of the glass frame. Some examples of this embodiment are illustrated in FIGS. 2-4, which are described in further detail below.

In accordance with another embodiment of the present disclosure, the light source encapsulant comprises a primary distributed color conversion medium, the color conversion medium of the quantum dot glass containment plate defines a supplemental emission field of the lighting device and the emission field defined by the primary distributed color conversion medium is spatially congruent with, but spectrally distinct from, the supplemental emission field defined by the quantum dot glass containment plate. One example of this embodiment is illustrated in FIG. 2, which is described in further detail below.

In accordance with yet another embodiment of the present disclosure, the lighting device comprises a primary glass containment plate comprising a primary distributed phosphor color conversion medium, the color conversion medium of the quantum dot glass containment plate defines a supplemental emission field of the lighting device, and the emission field defined by the distributed phosphor color conversion medium is spatially congruent with, but spectrally distinct from, the supplemental emission field defined by the quantum dot plate. One example of this embodiment is illustrated in FIG. 3, which is described in further detail below.

In accordance with an additional embodiment of the present disclosure, the COB LED light source comprises a thermal heat sink framework, the light source encapsulant is free of any distributed color conversion medium, the light source encapsulant comprises silicone, the quantum dot glass containment plate is positioned over the light source encapsulant cavity, the light source encapsulant is distributed over the LED at a thickness that is sufficient to encapsulate the LED and define encapsulant thermal conduction paths $T_{PE}$ extending through the light source encapsulant to the thermal heat sink framework from the distributed color conversion medium of the quantum dot glass containment plate, and the thickness of the light source encapsulant is such that the thermal conduction paths $T_{PE}$ extend less than approximately 100 µm through the light source encapsulant. One example of this embodiment is illustrated in FIG. 4, which is described in further detail below.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 2:
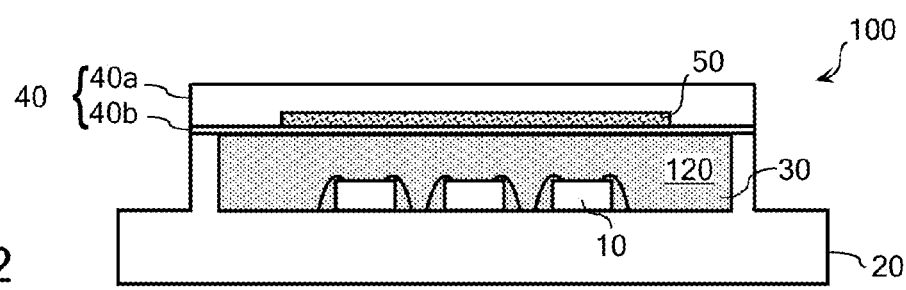
FIG. 2 is a schematic illustration of an LED lighting device according to one embodiment of the present disclosure.
Figure 3:
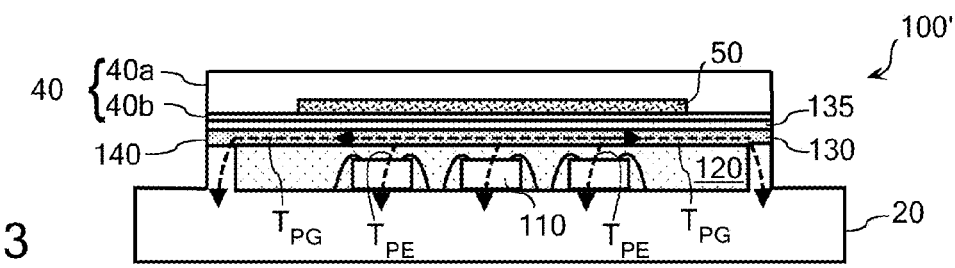
FIG. 3 is a schematic illustration of an LED lighting device according to another embodiment of the present disclosure.
Figure 4:
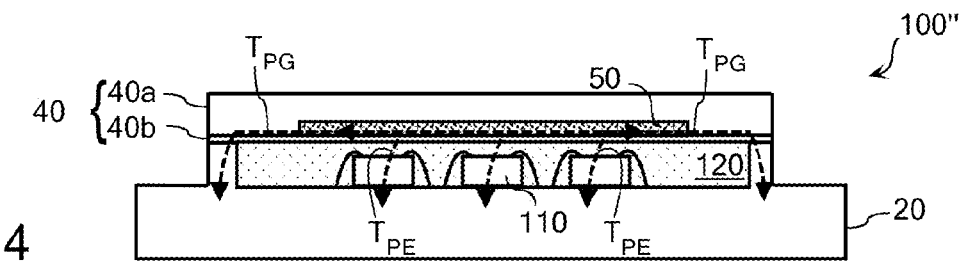
FIG. 4 is a schematic illustration of an LED lighting device according to yet another embodiment of the present disclosure.

FIGS. 2-4 illustrate COB LED lighting devices 100, 100', 100" that comprise at least one LED 110, a light source encapsulant 120, a quantum dot color conversion medium 50, a quantum dot glass containment plate 40, and a thermal heat sink framework in the form of, for example, a metal clad printed circuit board 20. The quantum dot distributed color conversion medium 50 is distributed in two dimensions over an emission field of the LED lighting device within the quantum dot glass containment plate 40 and comprises a quantum dot structure that is configured to convert the emission spectra of the LEDs to a longer or shorter wavelength.

Referring specifically to the configurations of FIGS. 2-4, it is noted that the quantum dot glass containment plate 40 is presented in the form of a glass containment frame comprising an interior volume defined between opposing, sealed glass panels 40a, 40b for containing the quantum dot distributed color conversion medium 50. The opposing, sealed glass panels comprise one cavity glass 40a and one sealing glass 40b. The sealing glass 40b is typically a relatively thin (about 100 μm) display grade glass, such as Willow which is a very thin (typically 100 μm) version of EAGLE XG® display glass available from Corning, Incorporated. A suitable cavity can be provided in the cavity glass 40a by any conventional or yet to be developed glass molding or glass machining technique including, for example, micromachining, laser-assisted machining or milling, laser ablation, etching, or combinations thereof. Sputtered glass can then be deposited on the underside of the sealing glass 40b and a laser can be used to peripherally bond the sealing glass 40b to the cavity glass while the quantum dots are resting in the cavity.

According to one set of contemplated embodiments, sealed glass panels for containing the aforementioned quantum dots may be constructed by providing a relatively low melting temperature (i.e., low $T_g$) glass sealing strip along a peripheral portion of a sealing surface of the sealing glass, the cavity glass, or both. In this manner, the cavity glass and the sealing glass, when brought into a mating configuration, cooperate with the glass sealing strip to define an interior volume that contains the quantum dots. The glass sealing strip may be deposited via physical vapor deposition, for example, by sputtering from a sputtering target.

A focused laser beam can be used to locally melt the low melting temperature glass sealing strip adjacent glass substrate material to form a sealed interface. In one approach, the laser can be focused through either the cavity glass or the sealing glass and then positionally scanned to locally heat the glass sealing strip and adjacent portions of the cavity glass and sealing glass. In order to affect local melting of the glass sealing strip, the glass sealing strip is preferably at least about 15% absorbing at the laser processing wavelength. The cavity glass and the sealing glass are typically transparent (e.g., at least 50%, 70%, 80% or 90% transparent) at the laser processing wavelength.

In an alternate embodiment, in lieu of forming a patterned glass sealing strip, a blanket layer of sealing (low melting temperature) glass can be formed over substantially all of a surface of sealing glass. An assembled structure comprising the cavity glass/sealing glass layer/sealing glass can be assembled as above, and a laser can be used to locally-define the sealing interface between the two substrates.

Laser 500 can have any suitable output to affect sealing. An example laser is a UV laser such as a 355 nm laser, which lies in the range of transparency for common display glasses. A suitable laser power can range from about 5 W to about 6.15 W. A translation rate of the laser (i.e., sealing rate) can range from about 1 mm/sec to 100 mm/sec, such as 1, 2, 5, 10, 20, 50 or 100 mm/sec. The laser spot size (diameter) can be about 0.5 to 1 mm.

The width of the sealed region, which can be proportional to the laser spot size, can be about 0.1 to 2 mm, e.g., 0.1, 0.2, 0.5, 1, 1.5 or 2 mm. A total thickness of a glass sealing layer can range from about 100 nm to 10 microns. In various embodiments, a thickness of the layer can be less than 10 microns, e.g., less than 10, 5, 2, 1, 0.5, or 0.2 microns. Example glass sealing layer thicknesses include 0.1, 0.2, 0.5, 1, 2, 5 or 10 microns.

In various embodiments of the present disclosure, the material of the glass sealing strip is transparent and/or translucent, relatively thin, impermeable, "green," and configured to form hermetic seals at low temperatures and with sufficient seal strength to accommodate large differences in CTE between the sealing material and the adjacent glass substrates. Further, it may be preferable to ensure that the material of the sealing strip is free of fillers, binders, and/or organic additives. The low melting temperature glass materials used to form the sealing material may or may not be formed from glass powders or ground glass.

In general, suitable sealing materials include low $T_g$ glasses and suitably reactive oxides of copper or tin. The glass sealing material can be formed from low $T_g$ materials such as phosphate glasses, borate glasses, tellurite glasses and chalcogenide glasses. As defined herein, a low $T_g$ glass material has a glass transition temperature of less than 400° C., e.g., less than 350° C., 300° C., 250° C., or 200° C. Example borate and phosphate glasses include tin phosphates, tin fluorophosphates, and tin fluoroborates. Sputtering targets can include such glass materials or, alternatively, precursors thereof. Example copper and tin oxides are CuO and SnO, which can be formed from sputtering targets comprising pressed powders of these materials.

Optionally, glass sealing compositions can include one or more dopants, including but not limited to tungsten, cerium and niobium. Such dopants, if included, can affect, for example, the optical properties of the glass layer, and can be used to control the absorption by the glass layer of laser radiation. For instance, doping with ceria can increase the absorption by a low $T_g$ glass barrier at laser processing wavelengths.

Example tin fluorophosphate glass compositions can be expressed in terms of the respective compositions of SnO, $SnF_2$ and $P_2O_5$ in a corresponding ternary phase diagram. Suitable tin fluorophosphates glasses include 20-100 mol % SnO, 0-50 mol % $SnF_2$ and 0-30 mol % $P_2O_5$. These tin fluorophosphates glass compositions can optionally include 0-10 mol % $WO_3$, 0-10 mol % $CeO_2$ and/or 0-5 mol % $Nb_2O_5$.

For example, a composition of a doped tin fluorophosphate starting material suitable for forming a glass sealing layer comprises 35 to 50 mole percent SnO, 30 to 40 mole percent $SnF_2$, 15 to 25 mole percent $P_2O_5$, and 1.5 to 3 mole percent of a dopant oxide such as $WO_3$, $CeO_2$ and/or $Nb_2O_5$.

A tin fluorophosphate glass composition according to one particular embodiment is a niobium-doped tin oxide/tin fluorophosphate/phosphorus pentoxide glass comprising about 38.7 mol % SnO, 39.6 mol % $SnF_2$, 19.9 mol % $P_2O_5$ and 1.8 mol % $Nb_2O_5$. Sputtering targets that can be used to form such a glass layer may include, expressed in terms of atomic mole percent, 23.04% Sn, 15.36% F, 12.16% P, 48.38% O and 1.06% Nb.

A tin phosphate glass composition according to an alternate embodiment comprises about 27% Sn, 13% P and 60% O, which can be derived from a sputtering target comprising, in atomic mole percent, about 27% Sn, 13% P and 60% O. As will be appreciated, the various glass compositions disclosed herein may refer to the composition of the deposited layer or to the composition of the source sputtering target.

As with the tin fluorophosphates glass compositions, example tin fluoroborate glass compositions can be expressed in terms of the respective ternary phase diagram compositions of SnO, $SnF_2$ and $B_2O_3$. Suitable tin fluoroborate glass compositions include 20-100 mol % SnO, 0-50 mol % $SnF_2$ and 0-30 mol % $B_2O_3$. These tin fluoroborate glass compositions can optionally include 0-10 mol % $WO_3$, 0-10 mol % $CeO_2$ and/or 0-5 mol % $Nb_2O_5$.

Additional aspects of suitable low $T_g$ glass compositions and methods used to form glass sealing layers from these materials are disclosed in commonly-assigned U.S. Pat. No. 5,089,446 and U.S. patent application Ser. Nos. 11/207,691, 11/544,262, 11/820,855, 12/072,784, 12/362,063, 12/763, 541 and 12/879,578.

Beyond that which is disclosed herein, the specific materials selected for the light source encapsulant 120, quantum dot distributed color conversion medium 50, quantum dot glass containment plate 40 and the thermal heat sink framework 20 can be gleaned from references like US PG Pub. No. 2012/0107622, which relates primarily to the use of color converting phosphors in LED lighting devices, US 2012/0175588, which relates to the use of light-converting, colloidal, doped semiconductor nanocrystals to provide monochromatic and white light sources based on LEDs, and U.S. Pat. No. 7,723,744, which relates to light-emitting devices that incorporate one or more underlying LED chips or other light sources and a layer having one or more populations of nanoparticles disposed over the light source. The nanoparticles absorb some light emitted by the underlying source, and re-emit light at a different level. By varying the type and relative concentration of nanoparticles, different emission spectra may be achieved.

Referring to the COB LED light source 100 of FIG. 2, it is contemplated that the light source encapsulant 120 may comprise a primary distributed color conversion medium 30 so that the color conversion medium 50 of the quantum dot glass containment plate defines a supplemental emission field of the lighting device 100. The emission field defined by the primary distributed color conversion medium is spatially congruent with, but spectrally distinct from, the supplemental emission field defined by the quantum dot glass containment plate. For example, and not by way of limitation, the emission spectrum of the emission field defined by the quantum dot glass containment plate 40 can be configured to add optical warmth to the emission spectrum of the emission field defined by the primary distributed phosphor color conversion medium 30 of the silicone light source encapsulant. In the case of red quantum dots, since quantum dots have a relatively narrow emission band, the issue of tailing into the IR can be avoided thus preserving good power efficiency. As an alternative to selecting a quantum dot plate of a particular color, it is contemplated that the sizes of the quantum dots contained can be adjusted to obtain the desired color. It is also contemplated that a variety of quantum dot sizes can also be blended to obtain a particular color, e.g., white.

In the embodiment of FIGS. 3 and 4, the light source encapsulant 120 is free of any distributed color conversion medium. However, in the embodiment of FIG. 3, the quantum dot glass containment plate 40 is disposed over a primary glass containment plate 140 and, as such, defines a supplemental emission field of the LED lighting device 100'. More specifically, the primary glass containment plate 140 comprises a primary distributed color conversion medium 130 and the emission field defined by the distributed color conversion medium 130 of the primary glass containment plate 140 is spatially congruent with, but spectrally distinct from, the supplemental emission field defined by the quantum dot distributed color conversion medium 50 of the quantum dot plate 40. In this manner, the emission spectrum of the emission field defined by the quantum dot plate 40 can be tailored to add optical warmth to the emission spectrum of the emission field defined by the distributed color conversion medium 130 of the primary glass containment plate 140. For example, where the distributed color conversion medium 130 of the primary glass containment plate 140 converts blue light from the LEDs 110 to yellow, the quantum dots of the quantum dot plate can be tailored to add warmth by converting some of the yellow light, as well as leaking blue light, to red—one advantage being that red quantum dots have a relatively narrow emission band, unlike red phosphors which waste light by tailing into the IR.

The primary glass containment plate 140 may be provided as an additional quantum dot glass containment plate, a glass containment frame comprising an interior volume for containing a color conversion medium, a glass containment matrix in which the color conversion is distributed, or any other substantially planar structural glass member, vessel, or assembly suitable for containing the color conversion medium. In manufacture, a silicone bonding layer 135 can be provided between the primary glass containment plate 140 and the quantum dot glass containment plate 40 to permit separate manufacture and subsequent bonding of the primary glass containment plate 140 and the quantum dot glass containment plate 40.

Referring to FIGS. 3 and 4, the light source 100', 100" can be described as comprising glassy thermal conduction paths $T_{PG}$ and encapsulant thermal conduction paths $T_{PE}$. The quantum dot glass containment plate 40 defines the glassy thermal conduction paths $T_{PG}$, which extend through the quantum dot glass containment plate 40 to the thermal heat sink framework 20 from the quantum dot distributed color conversion medium 50. The light source encapsulant 120 is distributed over the array of LEDs 110 at a thickness that is sufficient to encapsulate the LEDs 110, including their wire bonds and any other LED hardware, and defines the encapsulant thermal conduction paths $T_{PE}$, which extending through the light source encapsulant 120 to the thermal heat sink framework 20 from the quantum dot distributed color conversion medium 50.

As is noted above, the present disclosure introduces means by which heat can be more efficiently removed from the color converting layer of an LED lighting device and means that allow for a greater absolute temperature rise in the color converting layer. Both of these factors allow the LED(s) of the device to be driven harder, increasing total light output. To this end, the thickness of the light source encapsulant 120 is preferably tailored such that the thermal conduction paths $T_{PE}$ extend less than approximately 100 μm through the light source encapsulant 120. More preferably, it is contemplated that the thickness of the light source encapsulant can be tailored such that the thermal conduction paths $T_{PE}$ extend less than approximately 50 μm through the light source encapsulant 120.

The thermal performance of the structure may be expressed in terms of the thermal resistances of the heat paths $T_{PG}$ and $T_{PE}$, both of which are illustrated schematically in FIGS. 3 and 4. For practical dimensions, the relatively vertical heat path $T_{PE}$ dominates, mostly because its path is shorter than that of $T_{PG}$. The relatively thin glass encapsulant matrix design of FIGS. 3 and 4 reduces the temperature rise of the phosphor at comparable LED powers, which enables the LEDs to be driven at higher currents to produce more light. This advantage stems predominantly from the thin profile of the quantum dot glass containment plate 40 and the reduced thickness of the encapsulant layer 120 above the LEDs 110. In terms of thermal resistance, it is contemplated that the thickness of the light source encapsulant 120 can be tailored such that the thermal conduction paths $T_{PE}$ encounter a thermal resistance of less than approximately 15° C./W through the light source encapsulant 120.

Regarding the thermal conduction paths $T_{PE}$, $T_{PG}$, it is noted that heat flow H (watts) is proportional to the associated temperature gradient, which in one dimension x is dT/dx. Mathematically $$H = kA \frac{dT}{dx} \quad (1)$$

where k is the thermal conductivity of the material and A is the cross-sectional area of an infinitesimal slab of thickness dx through which the heat flows. If the heat flow is confined to one dimension in an insulated thermal path, then the solution to equation 1 is simply $$\Delta T \equiv T_2 - T_1 = \frac{HL}{kA} = R_{th}H \quad (2)$$

where $R_{th}$ is defined as the thermal resistance and L is the length of the thermal path.

Figure 1:
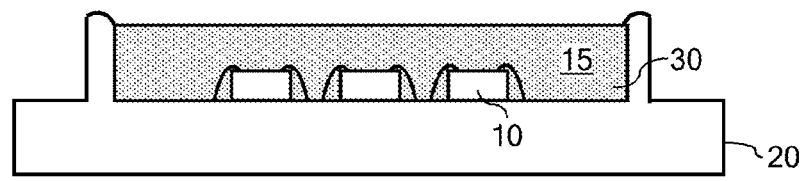
FIG. 1 illustrates an LED lighting device employing a phosphor-in-silicone color conversion medium.

For LED lighting device configurations like that illustrated in FIG. 1, the heat flow in the COB array is vertical from the phosphor through the thin (~5 μm thick) GaN LED and the underlying sapphire substrate to the heat sink. The array can be modeled as a one-dimensional heat flow and calculate the thermal resistance using equation (2) above. Working under the assumption that a 1000 lumen array will require about 10 watts electrical input, of which about 5 watts is dissipated as heat in the LED, the remaining 5 watts is emitted as blue light. In the color conversion process, about 1.3 watts is lost as heat in the phosphor, leaving about 3.7 watts total light output. The hottest plane in the package is the surface of the phosphor. The array can be modeled as two thermal resistances in series, i.e., the phosphor-in-silicone as the first thermal resistance and the sapphire LED substrate as the second thermal resistance. The GaN film is so thin, that its thermal resistance is negligible.

Relevant specifications for the thermal model are shown in the following table:

| | |
|---|---|
| Forward Voltage | 12.2 volts |
| Operating Current | 1050 mA |
| Junction-to-Case Thermal Resistance | 0.7 deg/Watt |
| LED lateral dimensions | 1.5 mm × 1.5 mm |
| LED thickness | 0.125 mm |
| Phosphor layer thickness (above LED) | 0.757 mm |
| Total die area | 9 × (1.5 mm)² = 36 mm² |

Since the thermal conductivity of sapphire is 17.35 watts/m-K at 70 degrees C., the thermal resistance (equation (2)) of the 36 mm² area, 0.125 mm thick sapphire is $R_s$=0.2 degrees/watt. The temperature rise in the phosphor layer is more complicated since the heat load is distributed throughout the film. Blue light would be expected to decay exponentially according to Beer's Law due to absorption and scatter, so the associated heat load should have the same distribution. Assuming 90% is absorbed in the t=0.757 mm thick phosphor layer, the absorption depth d, is about 0.3285 mm. The temperature of the hottest plane can be estimated assuming that the entire 1.3 watts generated in the phosphor flows through an equivalent thickness given by $$t_{eq} = d - \frac{te^{-t/d}}{1 - e^{-t/d}} \quad (3)$$

with t=0.757 mm and d=0.3285 mm, the equivalent thickness $t_{eq}$=0.244 mm. Assuming that the thermal conductivity of the phosphor-in-silicone is 0.22 watts/m-K, the same as silicone, then the thermal resistance of the phosphor layer is $R_p$=30.8 degrees/watt, about 60 times larger than the thermal resistance of the sapphire.

Using these data, we can estimate the temperature rise of the GaN LED and the phosphor film. Given an electrical input power of 12.8 W (12.2 volts×1.05 amps), we have 8.1 watts flowing through the sapphire and 1.66 watts dissipated in the phosphor. Assuming the heat sink temperature is 85° C., the temperatures of the LED and phosphor planes would be 87° C. and 138° C., respectively and can be readily compared with similarly modeled data representing the LED lighting device of FIG. 2, where the sapphire thermal resistance is the same, 0.20 degrees/watt, and the 1.66 watts generated in the ~150 μm thick phosphor-in-glass (PiG) film flows through the thin silicone film. The film should be as thin as possible to minimize the thermal resistance for heat flow from the phosphor-in-glass (PiG) film to the GaN heat sink and it is contemplated that a 50 μmm thickness should be enough to clear the LED wirebonds. Using the silicone thermal conductivity of 0.22 degree/m-watt, and the same 36 mm² total LED area, the thermal resistance of the vertical path is 6.3 degrees/watt.

The temperature rise of the phosphor with the same 1.66 watts thermal dissipation in the phosphor-in-glass (PiG) film is therefore 10 degrees, showing that the FIG. 2 configuration greatly reduces the phosphor temperature, as compared to the configuration of FIG. 1. These results are summarized in the following table:

| | Heat Sink Temperature | LED Temperature | Phosphor Temperature |
|---|---|---|---|
| FIG. 1 | 85° C. | 87° C. | 138° C. |
| FIG. 2 | 85° C. | 87° C. | 97° C. |

Similar results would be expected for the lighting device configurations of FIGS. 3 and 4.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Rather, the claims appended hereto should be taken as the sole representation of the breadth of the present disclosure and the corresponding scope of the various inventions described herein. Further, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that recitations herein of a component of the present disclosure being "configured" in a particular way, to embody a particular property, or to function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component. It is also noted that recitations herein of "at least one" component, element, etc., should not be used to create an inference that the alternative use of the articles "a" or "an" should be limited to a single component, element, etc.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the terms "about" and "approximately" are utilized herein to represent the inherent degree of uncertainty that may be attributed to any quantitative comparison, value, measurement, or other representation. The terms are also utilized herein to represent the degree by which a quantitative representation may vary from a stated reference without resulting in a change in the basic function of the subject matter at issue.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A lighting device comprising a chip-on-board (COB) light emitting diode (LED) light source, a light source encapsulant, a quantum dot distributed color conversion medium, and a quantum dot glass containment plate, wherein:
the COB LED light source comprises at least one LED and defines a light source encapsulant cavity in which the light source encapsulant is distributed over the LED;
the quantum dot glass containment plate is positioned over the light source encapsulant cavity and contains the distributed color conversion medium; and
the distributed color conversion medium comprises a quantum dot structure and is distributed in two dimensions over an emission field of the lighting device within the quantum dot glass containment plate;
the light source encapsulant comprises a primary distributed color conversion medium;
the color conversion medium of the quantum dot glass containment plate defines a supplemental emission field of the lighting device; and
the emission field defined by the primary distributed color conversion medium is spatially congruent with, but spectrally distinct from, the supplemental emission field defined by the quantum dot glass containment plate.

2. The lighting device of claim 1, wherein:
the quantum dot glass containment plate comprises a glass frame; and
the quantum dot structure is contained within an interior volume of the glass frame.

3. The lighting device of claim 1, wherein:
the quantum dot glass containment plate comprises opposing glass panels that are sealed at complementary edges to define an interior volume; and
the quantum dot structure is contained within the interior volume of the quantum dot glass containment plate.

4. The lighting device of claim 1, wherein the quantum dot glass containment plate comprises a variety of quantum dot sizes that are blended to obtain a particular color.

5. The lighting device of claim 1, wherein:
the light source encapsulant comprises silicone; and
the primary distributed color conversion medium comprises phosphor.

6. The lighting device of claim 1, wherein an emission spectrum of the emission field defined by the quantum dot glass containment plate adds optical warmth to an emission spectrum of the emission field defined by the primary distributed phosphor color conversion medium of the light source encapsulant.

7. A lighting device comprising a chip-on-board (COB) light emitting diode (LED) light source, a light source encapsulant, a quantum dot distributed color conversion medium, and a quantum dot glass containment plate, wherein:
the COB LED light source comprises at least one LED and defines a light source encapsulant cavity in which the light source encapsulant is distributed over the LED;
the quantum dot glass containment plate is positioned over the light source encapsulant cavity and contains the distributed color conversion medium; and
the distributed color conversion medium comprises a quantum dot structure and is distributed in two dimensions over an emission field of the lighting device within the quantum dot glass containment plate;
the lighting device comprises a primary glass containment plate comprising a primary distributed color conversion medium;
the color conversion medium of the quantum dot glass containment plate defines a supplemental emission field of the lighting device; and
the emission field defined by the distributed color conversion medium is spatially congruent with, but spectrally distinct from, the supplemental emission field defined by the quantum dot plate.

8. The lighting device of claim 7, wherein:
the primary glass containment plate comprises a glass matrix; and
the primary distributed color conversion medium comprises a phosphor distributed in the glass matrix.

9. The lighting device of claim 7, wherein:
the glass containment plate comprises a glass frame; and
the primary distributed color conversion medium comprises a quantum dot structure contained within an interior volume of the glass frame.

10. The lighting device of claim 7, wherein:
the primary distributed color conversion medium comprises a quantum dot structure;
the primary glass containment plate comprises opposing glass panels that are sealed at complementary edges to define an interior volume; and
the quantum dot structure is contained within the interior volume of the primary glass containment plate.

11. The lighting device of claim 7, wherein a bonding layer is provided between the primary glass containment plate and the quantum dot glass containment plate to permit separate manufacture and subsequent bonding of the primary glass containment plate and the quantum dot glass containment plate.

12. The lighting device of claim 7, wherein the primary glass containment plate comprises a variety of quantum dot sizes that are blended to obtain a particular color.

13. A lighting device comprising a chip-on-board (COB) light emitting diode (LED) light source, a light source encapsulant, a quantum dot distributed color conversion medium, and a quantum dot glass containment plate, wherein:
the COB LED light source comprises at least one LED and defines a light source encapsulant cavity in which the light source encapsulant is distributed over the LED;
the quantum dot glass containment plate is positioned over the light source encapsulant cavity and contains the distributed color conversion medium; and
the distributed color conversion medium comprises a quantum dot structure and is distributed in two dimensions over an emission field of the lighting device within the quantum dot glass containment plate;
the COB LED light source comprises a thermal heat sink framework;
the light source encapsulant is free of any distributed color conversion medium;
the light source encapsulant comprises silicone;
the quantum dot glass containment plate is positioned over the light source encapsulant cavity;
the light source encapsulant is distributed over the LED at a thickness that is sufficient to encapsulate the LED and define encapsulant thermal conduction paths $T_{PE}$ extending through the light source encapsulant to the thermal heat sink framework from the distributed color conversion medium of the quantum dot glass containment plate; and
the thickness of the light source encapsulant is such that the thermal conduction paths $T_{PE}$ extend less than approximately 100 μm through the light source encapsulant.

14. The lighting device of claim 13, wherein the thickness of the light source encapsulant is such that the thermal conduction paths $T_{PE}$ extend less than approximately 50 μm through the light source encapsulant.

15. The lighting device of claim 13, wherein the thickness of the light source encapsulant is such that the thermal conduction paths $T_{PE}$ encounter a thermal resistance of less than approximately 15° C./W through the light source encapsulant.

16. The lighting device of claim 13, wherein the thickness of the light source encapsulant is such that the thermal conduction paths $T_{PE}$ encounter a thermal resistance of less than approximately 10° C./W through the light source encapsulant.

* * * * *